(12) United States Patent
Chin

(10) Patent No.: US 11,832,446 B2
(45) Date of Patent: Nov. 28, 2023

(54) THREE-DIMENSIONAL MEMORY DEVICE

(71) Applicant: UNITED MICROELECTRONICS CORP., Hsin-Chu (TW)

(72) Inventor: Hock Chun Chin, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 115 days.

(21) Appl. No.: 17/065,508

(22) Filed: Oct. 7, 2020

(65) Prior Publication Data

US 2022/0077179 A1 Mar. 10, 2022

(30) Foreign Application Priority Data

Sep. 9, 2020 (CN) .......................... 202010940210.4

(51) Int. Cl.
| | |
|---|---|
| *H01L 29/10* | (2006.01) |
| *H01L 27/11* | (2006.01) |
| *H10B 43/27* | (2023.01) |
| *H10B 43/30* | (2023.01) |
| *H10B 51/20* | (2023.01) |
| *H01L 21/28* | (2006.01) |
| *H01L 29/78* | (2006.01) |
| *H01L 29/792* | (2006.01) |

(Continued)

(52) U.S. Cl.
CPC ........ *H10B 43/27* (2023.02); *H01L 29/40111* (2019.08); *H10B 43/30* (2023.02); *H10B 51/20* (2023.02); *H01L 29/40117* (2019.08); *H01L 29/78391* (2014.09); *H01L 29/7926* (2013.01); *H10B 43/35* (2023.02); *H10B 43/50* (2023.02)

(58) Field of Classification Search
CPC ......... H01L 27/11582; H01L 27/11524; H01L 27/11556; H01L 27/1157; H01L 27/11565; H01L 27/11521; H01L 27/11551; H01L 27/11568; H01L 27/11578; H01L 29/40114; H01L 29/40117; H01L 21/76816; H01L 21/76877
See application file for complete search history.

(56) References Cited

U.S. PATENT DOCUMENTS

| | | | | |
|---|---|---|---|---|
| 8,211,811 | B2 * | 7/2012 | Matsushita | ............ H10B 43/30 |
| | | | | 438/763 |
| 9,768,265 | B1 * | 9/2017 | Matsushita | ............ H10B 41/27 |
| 9,837,435 | B1 * | 12/2017 | Chang | ............... H01L 27/11578 |

(Continued)

OTHER PUBLICATIONS

Li, "Sub-60mV-Swing Negative-Capacitance FinFET without Hysteresis", IEDM15-620, 2015.

(Continued)

*Primary Examiner* — Mary A Wilczewski
*Assistant Examiner* — Tsz K Chiu
(74) *Attorney, Agent, or Firm* — Winston Hsu

(57) ABSTRACT

A three-dimensional (3D) memory device includes a channel structure extending along a first direction and a control gate structure extending along a second direction around the channel structure. Preferably, channel structure includes a negative capacitance (NC) insulating layer, a charge trap structure, and a channel layer, in which the NC insulating layer includes $HfZrO_x$ and the charge trap structure includes a blocking layer, a charge trap layer, and a tunneling layer.

6 Claims, 6 Drawing Sheets

(51) Int. Cl.
   *H10B 43/50*       (2023.01)
   *H10B 43/35*       (2023.01)

(56) References Cited

U.S. PATENT DOCUMENTS

| | | | | |
|---|---|---|---|---|
| 9,922,717 | B1* | 3/2018 | Maejima | G11C 16/08 |
| 10,164,009 | B1* | 12/2018 | Carlson | H01L 27/11556 |
| 10,756,185 | B2* | 8/2020 | Choi | H10B 43/10 |
| 10,777,576 | B1* | 9/2020 | Kim | H01L 21/0214 |
| 10,892,016 | B1* | 1/2021 | Or-Bach | H01L 27/11578 |
| 2011/0002178 | A1* | 1/2011 | Hwang | H01L 29/6656 |
| | | | | 257/314 |
| 2016/0172370 | A1* | 6/2016 | Makala | H01L 29/517 |
| | | | | 438/269 |
| 2016/0343718 | A1* | 11/2016 | Lu | H01L 27/11575 |
| 2019/0051661 | A1* | 2/2019 | Carlson | H01L 29/4234 |
| 2019/0371416 | A1* | 12/2019 | Kuddannavar | G11C 16/0483 |
| 2020/0013791 | A1* | 1/2020 | Or-Bach | H01L 29/40114 |
| 2021/0375933 | A1* | 12/2021 | Lu | H01L 29/516 |

OTHER PUBLICATIONS

Han, "Investigation of Negative Capacitance and Junctionless MOSFETs for CMOS Scaling", Nov. 23, 2018.
Hou, "Investigation for the Feasibility of High-Mobility Channel in 3D NAND Memory", ECS Journal of Solid State Science and Technology, May 3, 2018.

\* cited by examiner

THREE-DIMENSIONAL MEMORY DEVICE

BACKGROUND OF THE INVENTION

1. Field of the Invention

The invention relates to a three-dimensional (3D) memory device.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY OF THE INVENTION

According to an embodiment of the present invention, a three-dimensional (3D) memory device includes a channel structure extending along a first direction and a control gate structure extending along a second direction around the channel structure. Preferably, channel structure includes a negative capacitance (NC) insulating layer, a charge trap structure, and a channel layer, in which the NC insulating layer includes $HfZrO_x$ and the charge trap structure includes a blocking layer, a charge trap layer, and a tunneling layer.

According to an embodiment of the present invention, the NC insulating layer includes $HfZrO_x$, $PbZrTiO_x$, $BiFeO_3$, or a copolymer of poly(vinylidene fluoride (PVDF) and trifluoroethylene (TrFE).

According to an embodiment of the present invention, the charge trap structure includes a blocking layer, a charge trap layer, and a tunneling layer.

According to an embodiment of the present invention, the blocking layer includes silicon oxide.

According to an embodiment of the present invention, the charge trap layer includes silicon nitride.

According to an embodiment of the present invention, the tunneling layer includes silicon oxide.

According to an embodiment of the present invention, the control gate structure includes control gate layers extending along the second direction adjacent to two sides of the channel structure.

According to an embodiment of the present invention, a bottom select gate is disposed under the control gate and around the channel structure.

According to an embodiment of the present invention, a top select gate is disposed on the control gate and around the channel structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
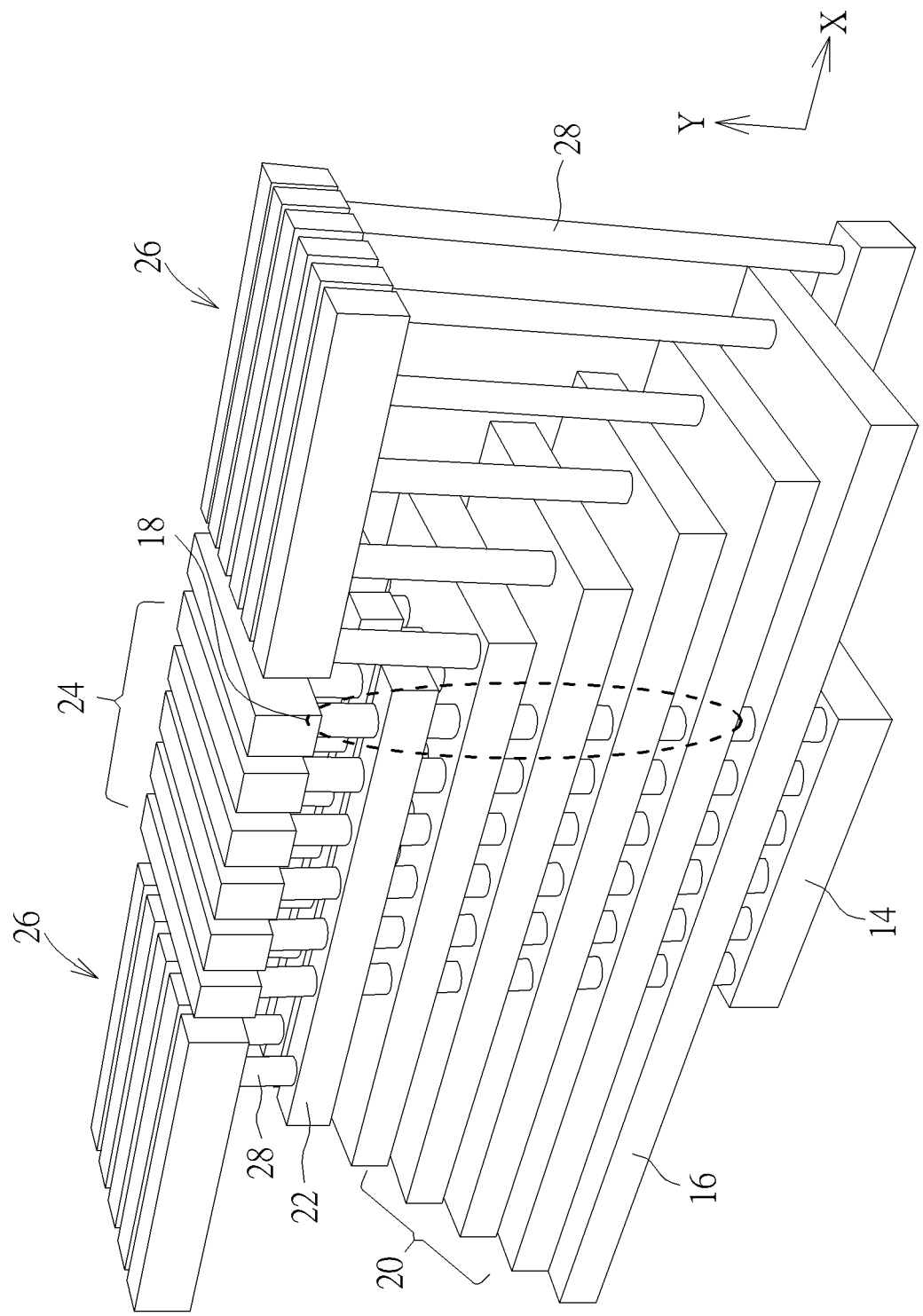
FIG. 1 illustrates a structural view of a 3D memory device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Referring to FIGS. 1-5, FIG. 1 illustrates a structural view of a 3D memory device according to an embodiment of the present invention and FIGS. 2-5 illustrate a method for fabricating a channel structure of the 3D memory device shown in FIG. 1. As shown in FIGS. 1-5, the 3D memory device preferably includes a channel structure 18 extending along a first direction such as Y-direction on a substrate 12, a control gate structure 20 extending along a second direction such as X-direction around the channel structure 18, a source line 14 and a bottom select gate 16 under the control gate structure 20, a top select gate 22, bit lines 24, and upper level metal interconnections 26 disposed on the control gate structure 20, and a plurality of contact plugs 28 connecting the source line 14, the bottom select gate 16, and the upper level metal interconnections 26.

In this embodiment, formation of the substrate 12 could be accomplished by forming a base substrate, forming at least one peripheral circuit on the substrate, forming at least one interconnection structure electronically contacting with the at least one peripheral circuit, and forming an epitaxial substrate on the at least one peripheral circuit. The base substrate can be formed by using any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, formation of the base substrate could be accomplished by a thinning process including grinding, wet/dry etching, chemical mechanical polishing (CMP), or any combination thereof.

The one or more peripheral circuits can include any suitable digital, analog, and/or mixed-signal peripheral circuits including, but not limited to, page buffers, decoders, and latches. In some embodiments, the one or more interconnection structures can include any suitable conductive structures including, but not limited to, contacts, single-layer/multi-layer vias, conductive layer(s), plugs, etc.

Epitaxial substrate can be formed above the one or more peripheral circuits by using a deposition process including, but not limited to, chemical vapor deposition (CVD), physical vapor deposition (PVD), atomic layer deposition (ALD), or any combination thereof. Epitaxial substrate can be a single layer substrate or a multi-layer substrate, for example, a monocrystalline single-layer substrate, a polycrystalline silicon (polysilicon) single-layer substrate, a polysilicon and metal multi-layer substrate, etc.

Figure 2:
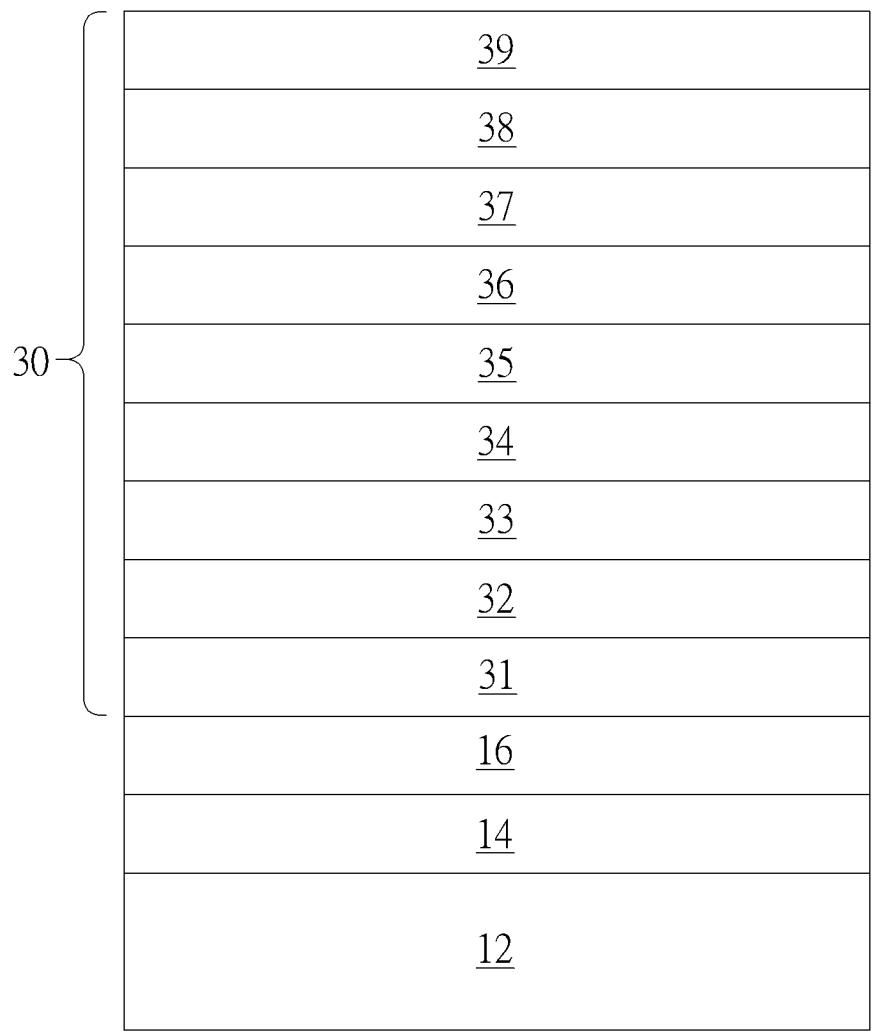
FIGS. 2-5 illustrate a method for fabricating a channel structure of the 3D memory device shown in FIG. 1.

Next, as shown in FIG. 2, an alternating dielectric stack structure 30 is formed on the substrate 12. In some embodiments, a plurality of dielectric layers 31, 32, 33, 34, 35, 36, 37, 38, 39 could be formed on the substrate 12 to form the alternating dielectric stack structure 30. In some embodiments, the odd number dielectric layers 31, 33, 35, 37, 39 and the even number dielectric layers 32, 34, 36, 38 are preferably made of different materials, in which each of the dielectric layers 31, 32, 33, 34, 35, 36, 37, 38, 39 could include dielectric material including but not limited to for example silicon oxide, silicon nitride, silicon oxynitride, or combination thereof. In this embodiment, the odd number dielectric layers 31, 33, 35, 37, 39 are preferably made of silicon oxide while the even number dielectric layers 32, 34, 36, 38 are made of silicon nitride, but not limited thereto. The alternating dielectric stack structure 30 could be formed by one or more thin film deposition process such as chemical vapor deposition (CVD), physical vapor deposition (PVD), atomic layer deposition (ALD), or combination thereof. It should further be noted that even though nine layers of dielectric layers are formed to constitute the alternating dielectric stack structure 30 in this embodiment, it would also be desirable to include any number of dielectric layers for the alternating dielectric structure 30.

Figure 3:
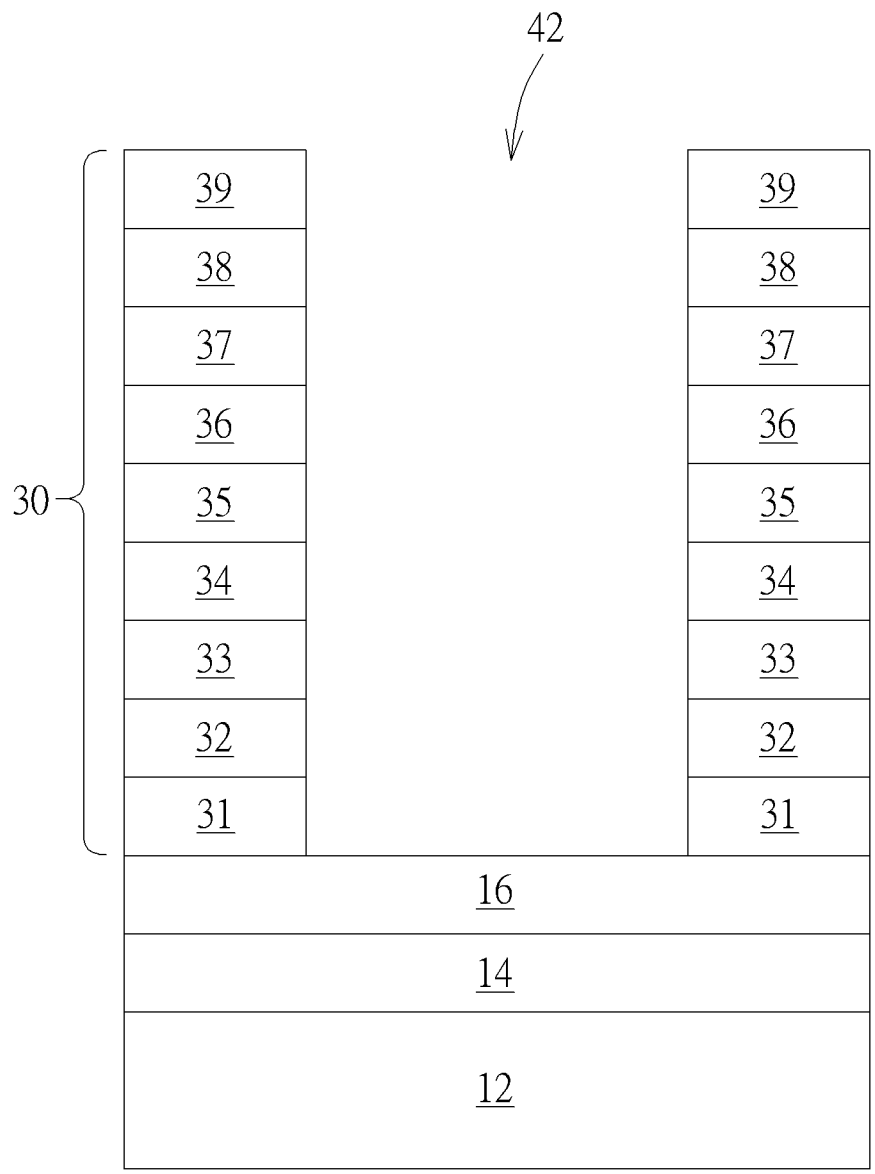

Next, a plurality of channel structures 18 are formed in the alternating dielectric stack structure 30, in which each of the channel structures 18 could be extending along a vertical direction and penetrating the alternating dielectric stack structure 30. As shown in FIG. 3, the formation of the channel structures 18 could be accomplished by first conducting a wet etching process and/or dry etching process to form at least a channel opening 42 penetrating the alternating dielectric stack structure 30 and extending along the vertical direction.

Figure 4:
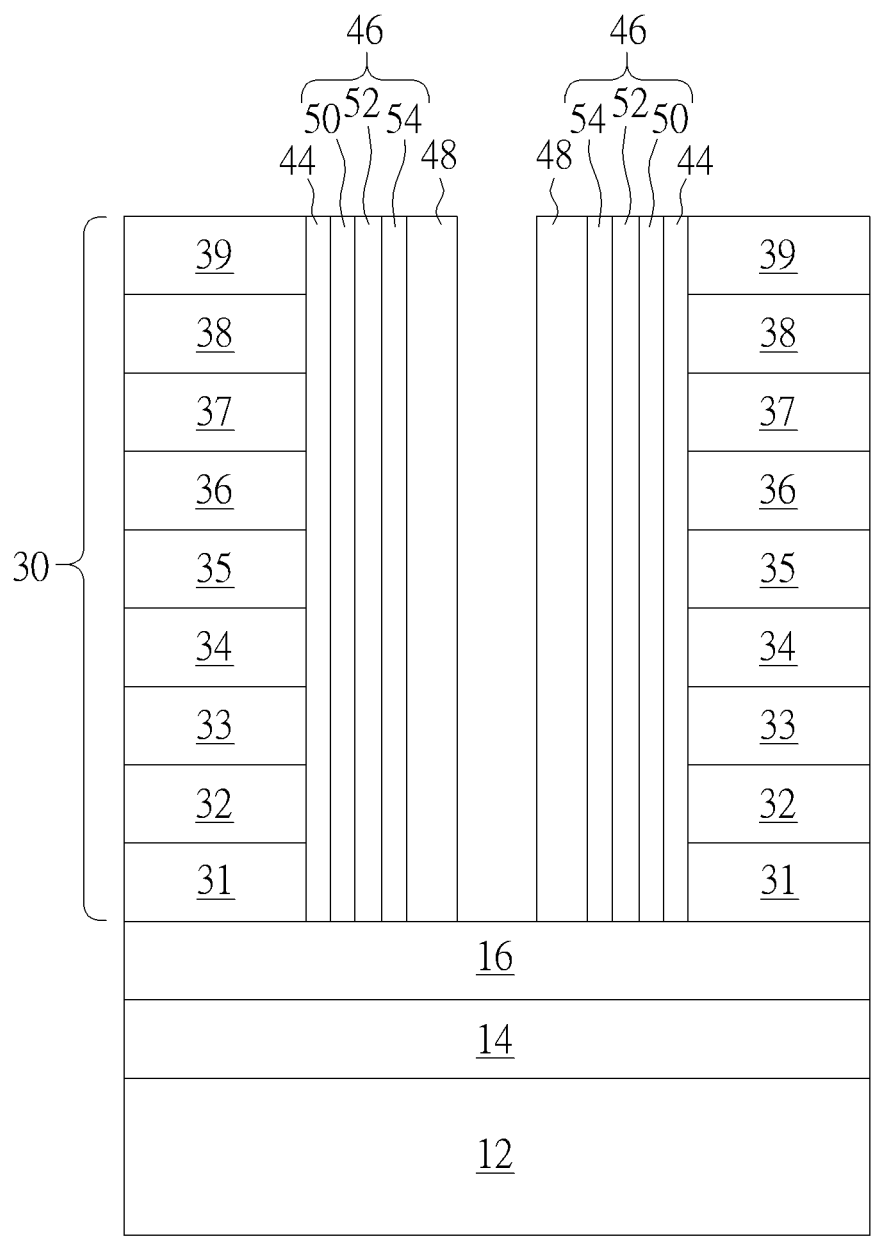

Next, as shown in FIG. 4, a negative capacitance (NC) insulating layer 44, a charge trap structure 46, and a channel layer 48 are formed in the channel opening 42. In this embodiment, the NC insulating layer 44 could include hafnium zirconium oxide ($HfZrO_x$), lead zirconate titanate ($PbZrTiO_x$), bismuth ferrite ($BiFeO_3$), a copolymer of poly (vinylidene fluoride (PVDF) and trifluoroethylene (TrFE), or combination thereof. In other embodiments the NC insulating layer 44 could be formed by multiple thin film deposition process including but not limited for example ALD process, epitaxial growth process, or spin coating process.

The charge trap structure 46 could include dielectric material including but not limited to for example silicon oxide, silicon nitride, silicon oxynitride, an oxide-nitrideoxide (ONO) structure, or combination thereof. In this embodiment, the charge trap structure 46 includes a blocking layer 50, a charge trap layer 52, and a tunneling layer 54, in which the blocking layer 60 includes silicon oxide, the charge trap layer 52 includes silicon nitride, and the tunneling layer 54 includes silicon oxide, but not limited thereto. The channel layer 48 could include semiconductor material including but not limited to for example silicon, germanium, or combination thereof.

Figure 5:
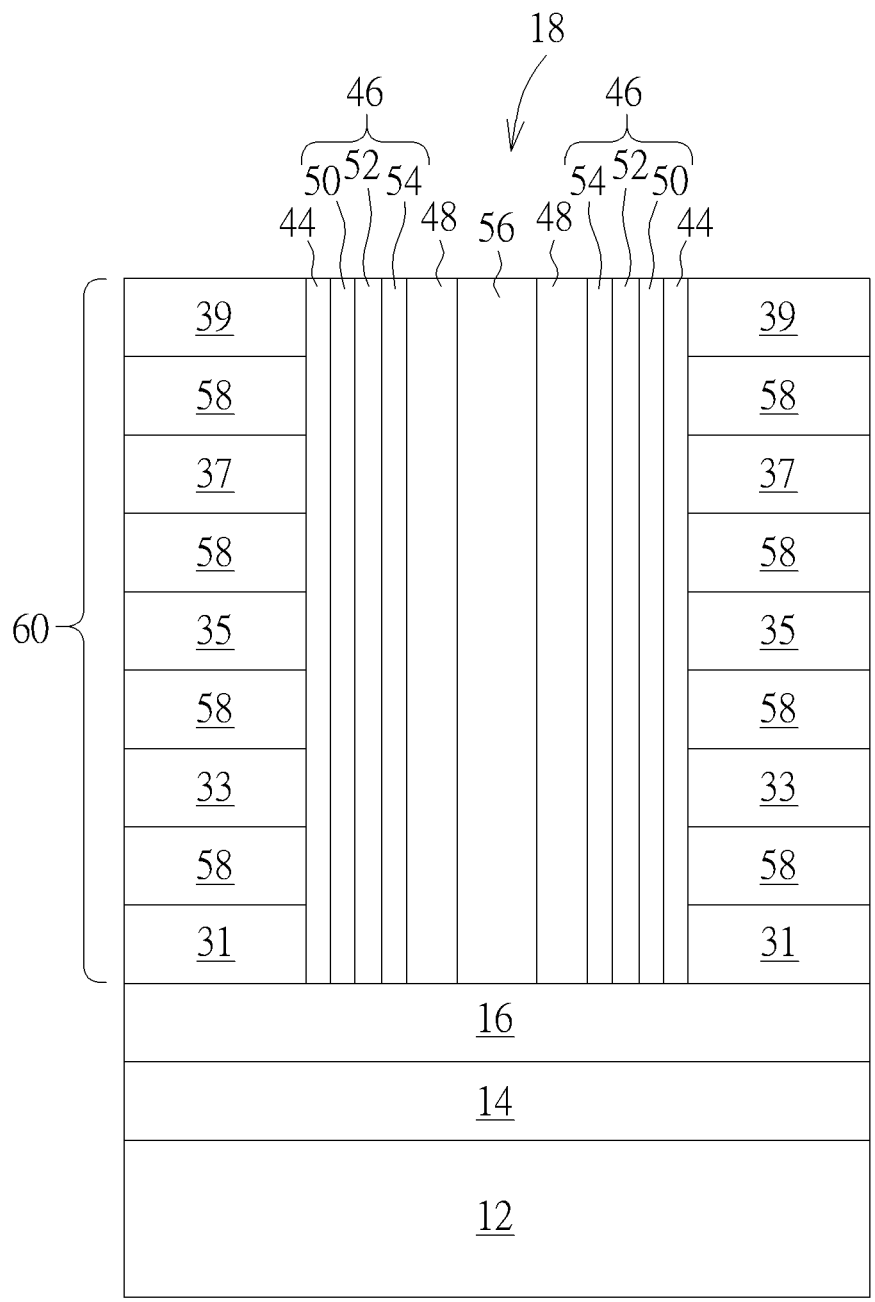

Next, as shown in FIG. 5, an insulating layer 56 could be formed to fill the channel opening 42 completely so that the insulating layer 56, the channel layer 48, the charge trap structure 46, and the NC insulating layer 44 would form the channel structure 18 altogether. Next, an etching process could be conducted to remove the even number layers such as the dielectric layers 32, 34, 36, 38 made of silicon nitride in the alternating dielectric stack structure 30, and then one or more deposition process could be conducted to form conductive layers in the location of the original even number dielectric layers 32, 34, 36, 38 for forming control gate layers 58, in which the control gate layers 58 and the odd number dielectric layers 31, 33, 35, 37, 39 together constitute a control gate stricter 60 altogether. In this embodiment, the insulating layer 56 could include dielectric material such as silicon oxide and the control gate layers 58 could include conductive material including but not limited to for example tungsten (W), cobalt (Co), copper (Cu), aluminum (Al), polysilicon, doped polysilicon, silicide, or combination thereof.

Figure 6:
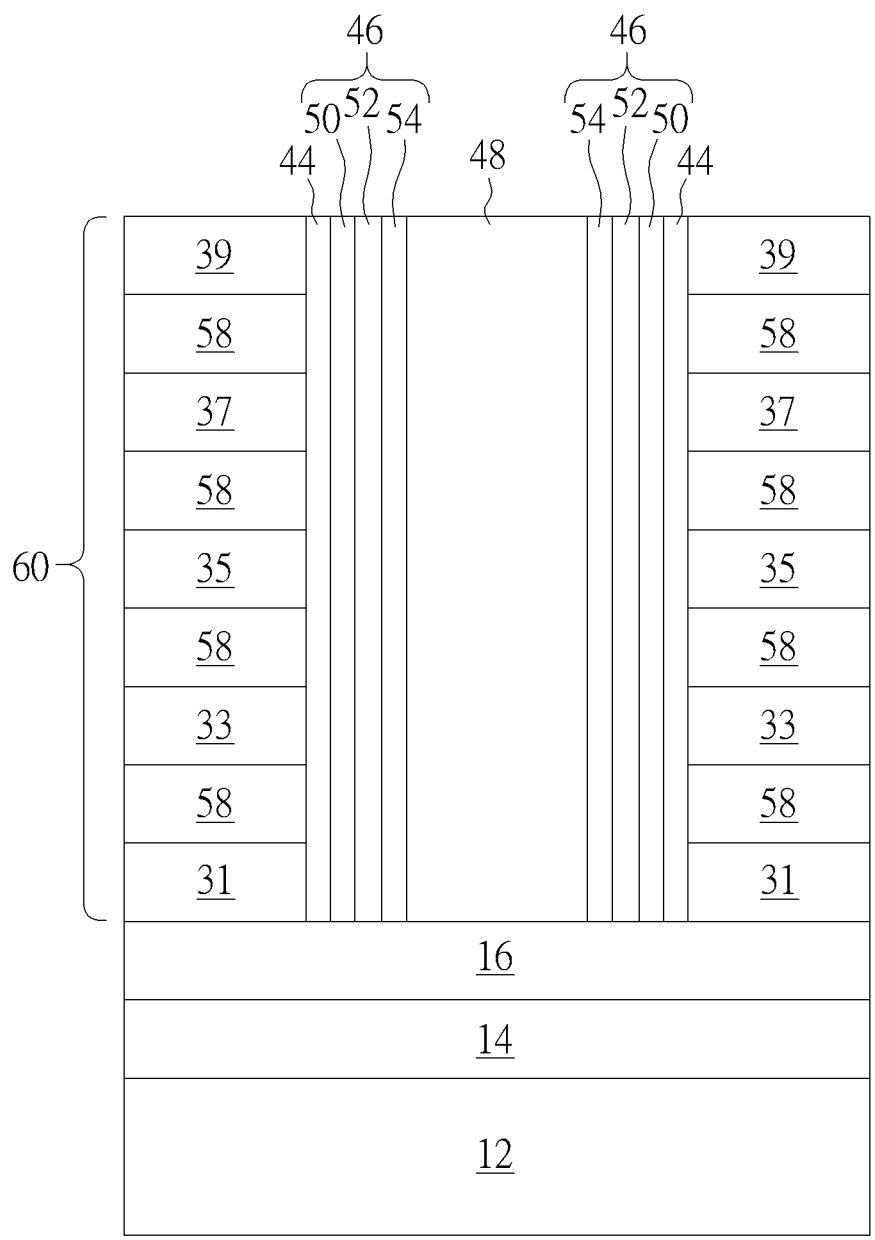
FIG. 6 illustrates a structural view of a 3D memory device according to an embodiment of the present invention.

It should be noted that even though an insulating layer 56 is formed to fill the channel opening 42 after the channel layer 48 is formed in this embodiment, according to another embodiment of the present invention as shown in FIG. 6, it would also be desirable to fill the channel opening 42 with the channel layer 48 directly by skipping the step of forming the insulating layer 56, which is also within the scope of the present invention. It should also be noted that even though the channel layer 48, the charge trap structure 46, and the NC insulating layer 44 are disposed adjacent to two sides of the insulating layer 56 in the cross-section perspective, the channel layer 48, the charge trap structure 46, and the NC insulating layer 44 are in fact surrounding the insulating layer 56 in the middle in a 3-dimensional perspective.

After the channel structure 18 is completed, it would be desirable to form elements such as the top select gate 22, the bit lines 24, the metal interconnections 26, and the contact plugs 28 afterwards. In this embodiment, each of the top select gate 22, the bit lines 24, the metal interconnections 26, and the contact plugs 28 could include conductive material including but not limited to for example tungsten (W), cobalt (Co), copper (Cu), aluminum (Al), polysilicon, doped polysilicon, silicide, or combination thereof.

Overall, the present invention forms an additional NC insulating layer 44 between the control gate structure and the channel layer in a 3D NAND memory device and the formation of this NC insulating layer could be used to achieve effects such as voltage amplification and power reduction thereby improving performance for the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) memory device, comprising:
    a channel structure extending along a first direction, wherein the channel structure comprises:
        a negative capacitance (NC) insulating layer, wherein the NC insulating layer comprises $PbZrTiO_x$ or a copolymer of poly(vinylidene fluoride) (PVDF) and trifluoroethylene (TrFE);
        a charge trap structure surrounded by the NC insulating layer, wherein the charge trap structure comprises a blocking layer, a charge trap layer and a tunneling layer, wherein the blocking layer comprises silicon oxide, and wherein the NC insulating layer contacts the blocking layer directly; and
        a channel layer; and
    a control gate structure extending along a second direction around the channel structure, wherein the NC insulating layer contacts the control gate structure directly.

2. The 3D memory device of claim 1, wherein the charge trap layer comprises silicon nitride.

3. The 3D memory device of claim 1, wherein the tunneling layer comprises silicon oxide.

4. The 3D memory device of claim 1, wherein the control gate structure comprises control gate layers extending along the second direction adjacent to two sides of the channel structure.

5. The 3D memory device of claim 1, further comprising a bottom select gate under the control gate and around the channel structure.

6. The 3D memory device of claim 1, further comprising a top select gate on the control gate and around the channel structure.

* * * * *